(12) United States Patent
Dewey et al.

(10) Patent No.: US 10,403,733 B2
(45) Date of Patent: Sep. 3, 2019

(54) DIELECTRIC METAL OXIDE CAP FOR CHANNEL CONTAINING GERMANIUM

(71) Applicant: Intel Corporation, Santa Clara, CA (US)

(72) Inventors: Gilbert Dewey, Hillsboro, OR (US); Ashish Agrawal, Santa Clara, CA (US); Benjamin Chu-Kung, Portland, OR (US); Van H. Le, Portland, OR (US); Matthew V. Metz, Portland, OR (US); Willy Rachmady, Beaverton, OR (US); Jack T. Kavalieros, Portland, OR (US); Rafael Rios, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/776,752

(22) PCT Filed: Dec. 24, 2015

(86) PCT No.: PCT/US2015/000500
§ 371 (c)(1),
(2) Date: May 16, 2018

(87) PCT Pub. No.: WO2017/111872
PCT Pub. Date: Jun. 29, 2017

(65) Prior Publication Data
US 2018/0374928 A1    Dec. 27, 2018

(51) Int. Cl.
*H01L 29/76* (2006.01)
*H01L 29/51* (2006.01)
(Continued)

(52) U.S. Cl.
CPC ............ *H01L 29/513* (2013.01); *H01L 29/16* (2013.01); *H01L 29/517* (2013.01);
(Continued)

(58) Field of Classification Search
CPC ............ H01L 29/785; H01L 29/66795; H01L 29/517; H01L 29/513; H01L 29/78; H01L 29/16; H01L 29/7851
(Continued)

(56) References Cited

U.S. PATENT DOCUMENTS

| | | | |
|---|---|---|---|
| 6,770,923 B2 * | 8/2004 | Nguyen | H01L 21/02178 257/295 |
| 7,329,913 B2 * | 2/2008 | Brask | H01L 21/823821 257/287 |

(Continued)

OTHER PUBLICATIONS

International Search Report and Written Opinion dated Sep. 23, 2016 for International Application No. PCT/US2015/000500, 13 pages.

*Primary Examiner* — Luan C Thai
(74) *Attorney, Agent, or Firm* — Schwabe, Williamson & Wyatt, P.C.

(57) ABSTRACT

Embodiments of the present disclosure describe semiconductor devices comprised of a semiconductor substrate with a metal oxide semiconductor field effect transistor having a channel including germanium or silicon-germanium, where a dielectric layer is coupled to the channel. The dielectric layer may include a metal oxide and at least one additional element, where the at least one additional element may increase a band gap of the dielectric layer. A gate electrode may be coupled to the dielectric layer. Other embodiments may be described and/or claimed.

20 Claims, 6 Drawing Sheets

(51) Int. Cl.
   *H01L 29/78* (2006.01)
   *H01L 29/16* (2006.01)
   *H01L 29/66* (2006.01)

(52) U.S. Cl.
   CPC ........ *H01L 29/66795* (2013.01); *H01L 29/78* (2013.01); *H01L 29/785* (2013.01); *H01L 29/7851* (2013.01)

(58) Field of Classification Search
   USPC ...................................................... 257/401
   See application file for complete search history.

(56) References Cited

U.S. PATENT DOCUMENTS

| | | | |
|---|---|---|---|
| 8,941,184 B2* | 1/2015 | Ando | H01L 21/823842 257/213 |
| 2002/0137250 A1 | 9/2002 | Nguyen et al. | |
| 2005/0280105 A1 | 12/2005 | Andreoni et al. | |
| 2006/0246710 A1 | 11/2006 | Cartier et al. | |
| 2008/0073723 A1 | 3/2008 | Rachmady et al. | |
| 2013/0154019 A1 | 6/2013 | Ando et al. | |
| 2014/0339646 A1* | 11/2014 | Joshi | H01L 21/26586 257/392 |

\* cited by examiner

DIELECTRIC METAL OXIDE CAP FOR CHANNEL CONTAINING GERMANIUM

CROSS REFERENCE TO RELATED APPLICATIONS

The present application is a national phase entry under 35 U.S.C. § 371 of International Application No. PCT/US2015/000500, filed Dec. 24, 2015, entitled "DIELECTRIC METAL OXIDE CAP FOR CHANNEL CONTAINING GERMANIUM", which designated, among the various States, the United States of America. The PCT/US2015/000500 Application is hereby incorporated by reference in its entirety.

FIELD

Embodiments of the present disclosure generally relate to semiconductor integrated circuits (ICs) and more specifically to semiconductor ICs with transistors having a germanium containing channel with a dielectric metal oxide cap on the channel.

BACKGROUND

Metal oxide semiconductor field effect transistor (MOSFET) channels with silicon-germanium or germanium generally have a gate stack that includes a silicon cap on the channel, a high κ dielectric layer on the silicon cap, and a gate electrode on the high kappa dielectric layer. Generally, a silicon cap is required between the channel and the high kappa dielectric layer to provide channel stability over time. Without a silicon cap, unstable germanium oxide or a sub-stoichiometric germanium metal oxide may form at the surface of the channel over time. The formation rate of these oxides may be increased by higher temperatures. These oxides may have dangling bonds and/or oxygen vacancies at the germanium oxide interface and may limit the ability of the gate to control the transistor, resulting in a less efficient transistor. A silicon cap may reduce the formation of these germanium oxides but may not eliminate it or reduce the impact. Therefore, over time, a germanium containing channel may form these oxides, resulting in degraded performance of transistors with germanium containing channels.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
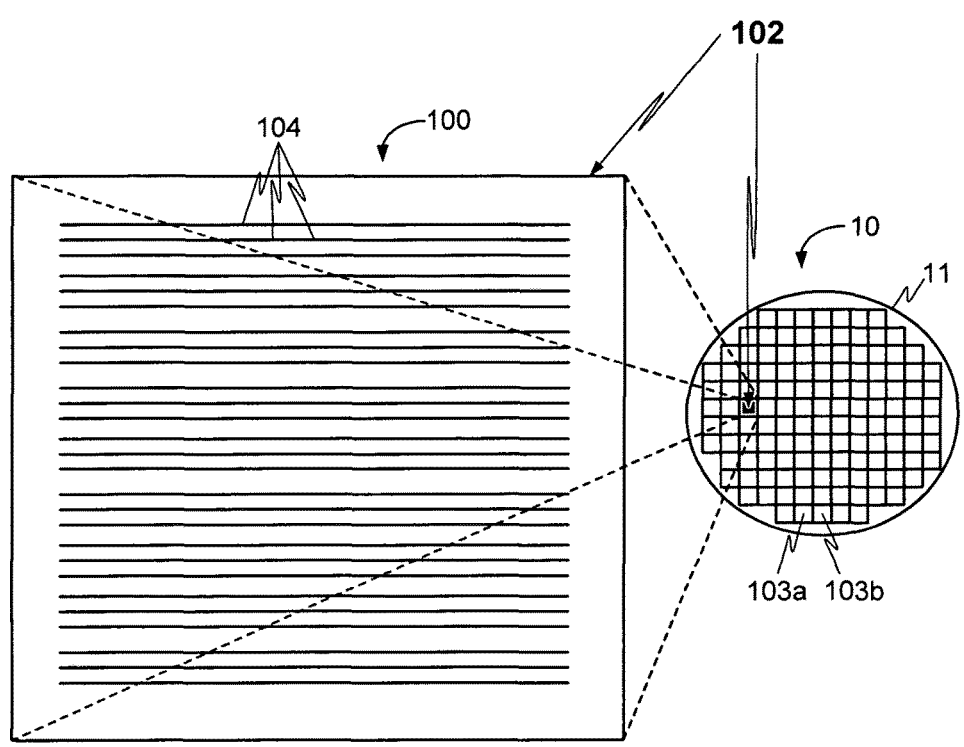
FIG. 1 schematically illustrates a top view of an example die in wafer form and in singulated form, in accordance with some embodiments.

Embodiments of the present disclosure describe transistors with a germanium containing channel with a dielectric metal oxide cap coupled to the channel for isolation, where the metal oxide contains one or more additional elements. Further embodiments describe processes of making the transistors, as well as devices and systems with the transistors.

In the following description, numerous specific details are set forth in order to provide a thorough understanding of the various embodiments. In other instances, well-known semiconductor processes and/or fabrication techniques may not be described in particular detail in order not to unnecessarily obscure the embodiments described herein. Additionally, illustrations of embodiments herein may omit certain structures and/or details in order to not obscure the embodiments described herein.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, side, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous. The term "coupled" may refer to a direct connection, an indirect connection, or an indirect communication.

The terms "coupled to" and "coupled with," along with all derivatives, may be used herein. "Coupled" may mean one or more of the following. "Coupled" may mean that two or more elements are in direct physical and/or electrical contact. However, "coupled" may also mean that two or more elements indirectly contact each other, but yet still cooperate or interact with each other, and may mean that one or more other elements are coupled or connected between the elements that are said to be coupled to each other. The term "directly coupled" may mean that two or more elements are in direct contact. By way of example and not limitation, "coupled" may mean two or more elements or devices are coupled by electrical connections on a printed circuit board such as a motherboard, for example. The electrical connections may provide direct physical coupling by way of the electrical connections. By way of example and not limitation, "coupled" may mean two or more elements/devices cooperate and/or interact through one or more network linkages such as wired and/or wireless networks. By way of example and not limitation, a computing apparatus may include two or more computing devices "coupled" by one or more network linkages.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, state machine, and/or other suitable components that provide the described functionality.

Various dielectric metal oxides may be useful as dielectric caps (isolation dielectric layers) on a channel of a MOSFET transistor. However, a metal oxide by itself may not be satisfactory for use on channels composed of germanium or a germanium containing material such as silicon-germanium. For example, titanium oxide or tantalum oxide, and the like, may have a band gap that is too narrow and/or an unfavorable band alignment with a germanium containing channel. This narrow band gap and/or unfavorable band gap alignment may result in a high gate leakage rate if these oxides are used as a cap. Accordingly, in some embodiments, the addition of one or more elements to a metal oxide, such as titanium oxide or tantalum oxide, may provide a wider band gap and/or better band gap alignment. In some embodiments, the addition of one or more elements may reduce gate leakage. In some embodiments, elements that may be added to a dielectric metal oxide cap to provide a wider band gap, better band gap alignment, and/or reduce gate leakage may include aluminum, silicon, nitrogen, zirconium, and/or hafnium, for example.

In some embodiments, a dielectric metal oxide cap with one or more elements may make the germanium of a germanium containing channel less prone to oxidation at the interface between the dielectric and the channel. A reduction or elimination of oxidation may be desirable for a transistor since oxidation may degrade transfer characteristics of a transistor with the germanium containing channel. A measure of germanium oxidation may be obtained by a capacitance-voltage measurement where kinks or bumps in a measurement curve may be indicative of the presence of a germanium oxide interfacial layer. These kinks or bumps may be an indication of trapped charges at an interface between a dielectric metal oxide cap and a germanium containing channel.

A dielectric metal oxide cap with one or more elements may provide a more stable interface over time between the dielectric cap and a germanium containing channel. In some embodiments, improved stability and/or reduced oxidation may be provided by a metal oxide composed of a metal having a large oxygen binding energy with one or more additional elements. By way of example, metals with large oxygen binding energies may include titanium, tantalum, and aluminum.

In some embodiments, further improvements in leakage control may be provided by a variable (graded) concentration of one or more elements through a thickness of the dielectric cap. In some embodiments, the concentration of the one or more elements may be adjusted to change a band gap of the metal oxide from a narrow band gap to a wider band gap and/or to provide a better band gap match between the dielectric metal oxide cap and the germanium containing channel. For example, $TiO_2$ may have a relatively small band gap for an oxide. In contrast, $Al_2O_3$ may be an oxide with a large band gap. These may be mixed to form $Ti_xAl_{(1-x)}O$. When adding Aluminum to the $TiO_2$, the band gap of the ternary oxide may increase from value near $TiO_2$ (small) to a value closer to $Al_2O_3$ (large) with the addition of Al to $TiO_2$. As another example, the band gap of $TiO_2$ may be increased by addition of one or more of hafnium, zirconium, or silicon, and in some instances nitrogen. As another example, the band gap of $Ta_2O_5$ may be increased by the addition of one or more of aluminum, hafnium, zirconium, or silicon, and in some instances, nitrogen. In other words, the selection of the metal oxide and the additional element(s) added to the metal oxide, as well as the concentration through the thickness of the cap, may allow engineering of a band gap and/or band gap alignment to provide improved matching with a germanium containing channel. This improved band gap and/or band gap alignment may reduce gate leakage and provide better stability over time. A transistor with metal oxide dielectric caps doped with one or more additional elements may be useful for an advanced metal oxide semiconductor field effect transistor (MOSFET) for logic applications.

To ensure proper concentration of elements through a thickness of a cap, various analytical techniques may be used. By way of example, some of the techniques may include Transmission Electron Microscopes (TEM), X-ray Photoelectron Spectroscopy (XPS), and Secondary Ion Mass Spectrometry (SIMS), and other analytical end of line techniques.

FIG. 1 schematically illustrates a top view of an example die 102 in wafer form 10 and in singulated form 100, in accordance with some embodiments. In some embodiments, the die 102 may be one of a plurality of dies (e.g., dies 102, 103a, 103b) of a wafer 11 composed of semiconductor material such as, for example, silicon or other suitable material. The plurality of dies may be formed on a surface of the wafer 11. Each of the dies may be a repeating unit of a semiconductor product that includes one or more transistor assemblies and/or other device assemblies that include transistors having a germanium containing channel with a dielectric metal oxide cap containing one or more additional elements, as disclosed herein. In some embodiments, the transistors may be advanced metal oxide field effect transistors for logic applications. In some embodiments, the transistors may be multi-gate transistors, such as tri-gate transistors. For example, the die 102 may include circuitry having transistor structures 104 and/or other device structures that include the transistors having a germanium containing channel with a dielectric metal oxide cap containing one or more additional elements as described herein. A dielectric metal oxide cap with one or more additional elements may provide a more stable interface between the dielectric and a germanium containing channel. Additionally, a dielectric metal oxide cap with one or more additional elements may make the germanium of a germanium containing channel less prone to oxidation at the interface between the dielectric and the channel. A reduction in germanium oxide formation and/or minimizing the impact of germanium oxide may allow better control of the channel over time.

Although the transistor structures 104 are depicted in rows that traverse a substantial portion of the die 102 in FIG. 1 for the sake of simplicity, it is to be understood that the transistor structures 104 may be configured in any of a wide variety of other suitable arrangements on the die 102 in other embodiments, including, for example, vertical and horizontal features having much smaller dimensions than depicted. After a fabrication process of the semiconductor product embodied in the dies is complete, the wafer 11 may undergo a singulation process in which each of the dies (e.g., die 102) is separated from one another to provide discrete "chips" of the semiconductor product. The wafer 11 may be any of a variety of sizes. In some embodiments, the wafer 11 has a diameter ranging from approximately 25.4 mm to approximately 450 mm. The wafer 11 may include other sizes and/or other shapes in other embodiments. According to various embodiments, the transistor structures 104 may be disposed on a semiconductor substrate in wafer form 10 or singulated form 100. The transistor structures 104 described herein may be incorporated in a die 102 for logic or memory, or combinations thereof. In some embodiments, the transistor structures 104 may be part of a system-on-chip (SoC) assembly.

Figure 2:
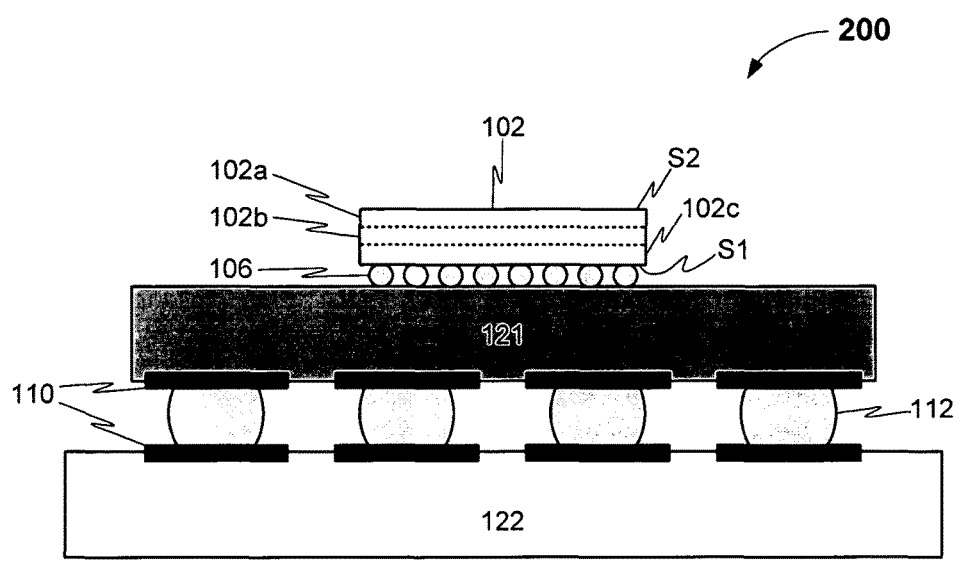
FIG. 2 schematically illustrates a cross-section side view of an integrated circuit (IC) assembly, in accordance with some embodiments.

FIG. 2 schematically illustrates a cross-section side view of an integrated circuit (IC) assembly 200, in accordance with some embodiments. In some embodiments, the IC assembly 200 may include one or more dies (hereinafter "die 102") electrically and/or physically coupled with a package substrate 121. In some embodiments, the package substrate 121 may be electrically coupled with a circuit board 122, as can be seen. In some embodiments, an integrated circuit (IC) assembly 200 may include one or more of the die 102, package substrate 121 and/or circuit board 122, according to various embodiments.

Embodiments described herein for transistors having a germanium containing channel with a dielectric metal oxide cap containing one or more additional elements may be incorporated in the one or more die 102, according to various embodiments. In some embodiments, the transistors may be advanced metal oxide field effect transistors for logic applications. In some embodiments, the transistors may be multi-gate transistors, such as tri-gate transistors. A dielectric metal oxide cap with one or more additional elements may provide a more stable interface between the dielectric and a germanium containing channel. Additionally, a dielectric metal oxide cap with one or more additional elements may make the germanium of a germanium containing channel less prone to oxidation at the interface between the dielectric and the channel. A reduction in germanium oxide formation and/or minimizing the impact of germanium oxide may allow better control of the channel over time.

The die 102 may represent a discrete product made from a semiconductor material (e.g., silicon) using semiconductor fabrication techniques such as thin film deposition, lithography, etching and the like used in connection with forming complementary metal oxide semiconductor (CMOS) devices. In some embodiments, the die 102 may be, include, or be a part of a processor, memory, system-on-chip (SoC), or ASIC. In some embodiments, an electrically insulative material such as, for example, molding compound or underfill material (not shown) may encapsulate at least a portion of the die 102 and/or die-level interconnect structures 106.

The die 102 can be attached to the package substrate 121 according to a wide variety of suitable configurations including, for example, being directly coupled with the package substrate 121 in a flip-chip configuration, as depicted. In the flip-chip configuration, an active side, S1, of the die 102 including circuitry is attached to a surface of the package substrate 121 using die-level interconnect structures 106 such as bumps, pillars, or other suitable structures that may also electrically couple the die 102 with the package substrate 121. The active side S1 of the die 102 may include active devices such as, for example, transistor devices. An inactive side, S2, may be disposed opposite to the active side S1, as can be seen.

The die 102 may generally include a semiconductor substrate 102a, one or more device layers (hereinafter "device layer 102b") and one or more interconnect layers (hereinafter "interconnect layer 102c"). The semiconductor substrate 102a may be substantially composed of a bulk semiconductor material such as, for example, silicon, in some embodiments. The device layer 102b may represent a region where active devices such as transistor devices are formed on the semiconductor substrate. The device layer 102b may include, for example, transistor structures such as channel bodies and/or source/drain regions of transistor devices. The interconnect layer 102c may include interconnect structures (e.g., electrode terminals) that are configured to route electrical signals to or from the active devices in the device layer 102b. For example, the interconnect layer 102c may include horizontal lines (e.g., trenches) and/or vertical plugs (e.g., vias) or other suitable features to provide electrical routing and/or contacts.

In some embodiments, the die-level interconnect structures 106 may be electrically coupled with the interconnect layer 102c and configured to route electrical signals between the die 102 and other electrical devices. The electrical signals may include, for example, input/output (I/O) signals and/or power/ground signals that are used in connection with operation of the die 102.

In some embodiments, the package substrate 121 is an epoxy-based laminate substrate having a core and/or build-up layers such as, for example, an Ajinomoto Build-up Film (ABF) substrate. The package substrate 121 may include other suitable types of substrates in other embodiments including, for example, substrates formed from glass, ceramic, or semiconductor materials.

The package substrate 121 may include electrical routing features configured to route electrical signals to or from the die 102. The electrical routing features may include, for example, pads or traces (not shown) disposed on one or more surfaces of the package substrate 121 and/or internal routing features (not shown) such as, for example, trenches, vias or other interconnect structures to route electrical signals through the package substrate 121. For example, in some embodiments, the package substrate 121 may include electrical routing features such as pads (not shown) configured to receive the respective die-level interconnect structures 106 of the die 102.

The circuit board 122 may be a printed circuit board (PCB) composed of an electrically insulative material such as an epoxy laminate. For example, the circuit board 122 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Interconnect structures (not shown) such as traces, trenches, or vias may be formed through the electrically insulating layers to route the electrical signals of the die 102 through the circuit board 122. The circuit board 122 may be composed of other suitable materials in other embodiments. In some embodiments, the circuit board 122 is a motherboard.

Package-level interconnects such as, for example, solder balls 112 may be coupled to one or more pads (hereinafter "pads 110") on the package substrate 121 and/or on the circuit board 122 to form corresponding solder joints that are configured to further route the electrical signals between the package substrate 121 and the circuit board 122. The pads 110 may be composed of any suitable electrically conductive material such as metal including, for example, nickel (Ni), palladium (Pd), gold (Au), silver (Ag), copper (Cu), and combinations thereof. Other suitable techniques to physically and/or electrically couple the package substrate 121 with the circuit board 122 may be used in other embodiments.

The IC assembly 200 may include a wide variety of other suitable configurations in other embodiments including, for example, suitable combinations of flip-chip and/or wire-bonding configurations, interposers, multi-chip package configurations including system-in-package (SiP) and/or package-on-package (PoP) configurations. Other suitable techniques to route electrical signals between the die 102 and other components of the IC assembly 200 may be used in some embodiments.

Figure 3A:
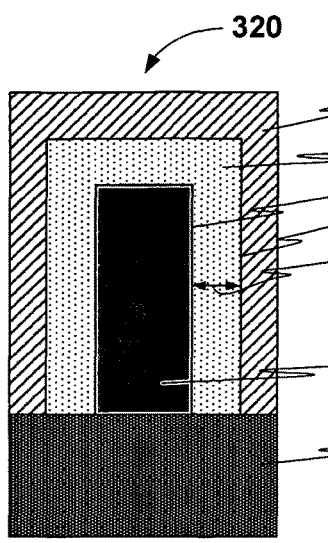
FIG. 3A schematically illustrates a fin cut cross section of a MOSFET gate stack comprised of a germanium containing channel with a dielectric layer, in accordance with some embodiments.
Figure 3B:
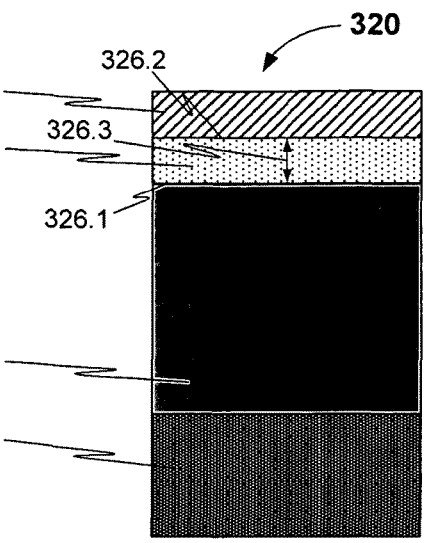
FIG. 3B schematically illustrates a gate cut cross section of a MOSFET gate stack comprised of a germanium containing channel with a dielectric layer, in accordance with some embodiments.
Figure 3C:
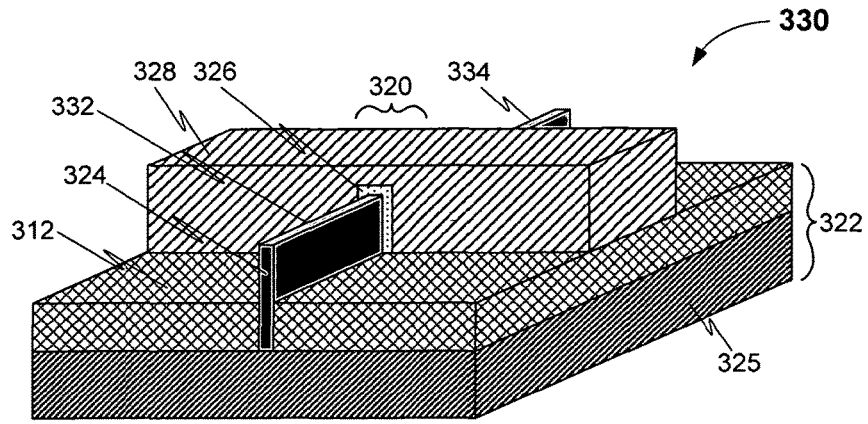
FIG. 3C schematically illustrates a perspective view of a MOSFET including a gate stack comprised of a germanium containing channel with a dielectric layer, in accordance with some embodiments.

FIG. 3A schematically illustrates a fin cut cross section of a MOSFET gate stack 320 comprised of a germanium containing channel with a dielectric layer 326, in accordance with some embodiments. FIG. 3B schematically illustrates a gate cut cross section of a MOSFET gate stack 320 comprised of a germanium containing channel with a dielectric layer 326, in accordance with some embodiments. FIG. 3C schematically illustrates a perspective view of a MOSFET 330 including a gate stack 320 comprised of a germanium containing channel with a dielectric layer 326, in accordance with some embodiments.

The example gate stack 320 illustrated is of a tri-gate transistor as illustrated by example MOSFET 330, which may include source 332 and drain 334. The source 332 and the drain 334 may be a raised source and a raised drain. In some embodiments, the MOSFET gate stack 320 may include a semiconductor substrate 322, a germanium containing channel fin 324, a dielectric layer 326 including a metal oxide with one or more additional elements, and a metal electrode 328, as illustrated. In some embodiments, the semiconductor substrate 322 may include shallow trench isolation structures 312 coupled to a substrate 325 as illustrated. In some embodiments, the shallow trench isolation structures 312 may be comprised of a dielectric oxide material. In some embodiments, the substrate 325 may be a silicon semiconductor substrate. In some embodiments, the substrate 325 may be a germanium containing semiconductor substrate. In some embodiments, the substrate 325 and the germanium containing channel fin 324 may be comprised of the same germanium containing semiconductor material. In some embodiments, the substrate 325 and the germanium containing channel fin 324 may be comprised of one semiconductor body comprised of a germanium containing semiconductor material. In some embodiments, the MOSFET gate stack 320 may replace a silicon cap and a high kappa dielectric cap of some current MOSFET gate stacks on germanium containing channels.

Although FIGS. 3A-3C illustrate a gate stack for tri-gate transistors, the various features and caps illustrated may be implemented in planar MOSFET transistors, as well as other multi-gate transistors with a channel containing germanium. A dielectric metal oxide cap with one or more additional elements may provide a more stable interface between the dielectric and a germanium containing channel. Additionally, a dielectric metal oxide cap with one or more additional elements may make the germanium of a germanium containing channel less prone to oxidation at the interface between the dielectric and the channel. A reduction in germanium oxide formation and/or minimizing the impact of germanium oxide may allow better control of the channel over time.

In some embodiments, the MOSFET gate stack 320 may be included in a plurality of transistors of different types in various semiconductor devices. For example, the MOSFET gate stack 320 may be included in a plurality of tri-gate transistors in various semiconductor devices, where the MOSFET gate stack 320 may include the semiconductor substrate 322 having a channel fin 324 composed of a germanium semiconductor or a silicon-germanium semiconductor. In some embodiments, the channel fin 324 may be a portion of a fin of a MOSFET 330 as illustrated in FIG. 3C by way of example. The MOSFET gate stack 320 included in various semiconductor devices further may include the dielectric layer 326 with a first surface 326.1 coupled to the channel fin 324 and composed of a metal oxide having at least one additional element. The metal oxide may have the at least one additional element interspersed with the metal oxide as a mixture deposited by atomic layer deposition. In some embodiments, the at least one additional element may increase a band gap of the metal oxide, thereby increasing the band gap of the dielectric layer 326. The MOSFET gate stack 320 included in various semiconductor devices further may include a gate electrode coupled to a second surface 326.2 of the dielectric layer 326, the second surface 326.2 opposite the first surface 326.1 through a thickness 326.3 of the dielectric layer 326.

In some embodiments, the semiconductor substrate 322 may be a silicon semiconductor substrate. In some embodiments, the semiconductor substrate 322 may be a germanium semiconductor substrate. In some embodiments, the semiconductor substrate 322 may be a silicon-germanium semiconductor substrate. In some embodiments, the semiconductor substrate 322 and the channel fin 324 may be comprised of a one body comprised of a germanium containing semiconductor material.

In some embodiments, the MOSFET gate stack 320 may be included in a tri-gate transistor of a semiconductor device, wherein a fin of the tri-gate transistor may be coupled to and extend from the semiconductor substrate 322 and span a source, a gate, and a drain of the tri-gate transistor, wherein the channel fin 324 includes a top surface and two opposite side surfaces of the fin spanning the gate between the source and the drain, wherein the fin is composed of a germanium semiconductor or a silicon-germanium semiconductor. In some embodiments, the source may be a raised source, and the drain may be a raised drain.

In some embodiments, the channel fin 324 may be a fin of a tri-gate transistor, and the semiconductor substrate 322 and the channel fin 324 may be a single body composed of a germanium semiconductor substrate or a silicon-germanium semiconductor substrate. In some embodiments, the channel fin 324 may be a fin of a tri-gate transistor, and the fin may be composed of germanium. In some embodiments, the top surface of the fin may include a 100 crystal plane and the two side opposite surfaces may include a 110 crystal plane. In some embodiments, the channel is undoped. In some embodiments, the channel is doped with a p-type dopant.

In some embodiments, the metal oxide of the dielectric layer 326 may include at least one of titanium oxide or tantalum oxide. In some embodiments, the at least one additional element of the dielectric layer 326 may include at least one of aluminum, silicon, nitrogen, zirconium, or hafnium. In some embodiments, the metal oxide of the dielectric layer 326 may be titanium dioxide, and the at least one additional element may be aluminum.

In some embodiments, the dielectric layer 326 may have a first concentration of the at least one additional element at the first surface 326.1 and a second concentration of the at least one additional element at the second surface 326.2, wherein the first concentration may be lower than the second concentration. In some embodiments, the concentration of the at least one additional element increases monotonically through the thickness 326.3 of the dielectric layer 326 from the first surface 326.1 to the second surface 326.2. In some embodiments, the first concentration is from about 0% to about 30% by weight and the second concentration is from about 30% to about 70% by weight, wherein the balance of the weight percentage is metal of the metal oxide. For clarity, the weight percentage is calculated without taking into account the oxygen content of the metal oxide. By way of example, a metal oxide that includes 50% aluminum is comprised of 50% of the metal of the metal oxide and 50% aluminum. In some embodiments, the first concentration may be about 5%, and the second concentration may be about 30% to about 40%. In some embodiments, the first concentration may be from about 20% to about 30%, and the second concentration may be up to about 70%. In some embodiments, the first concentration, the second concentration, and a concentration profile through the thickness of the dielectric layer of the at least one additional element are selected to increase the band gap of the metal oxide of the dielectric layer 326 by at least three electron volts.

Figure 4:
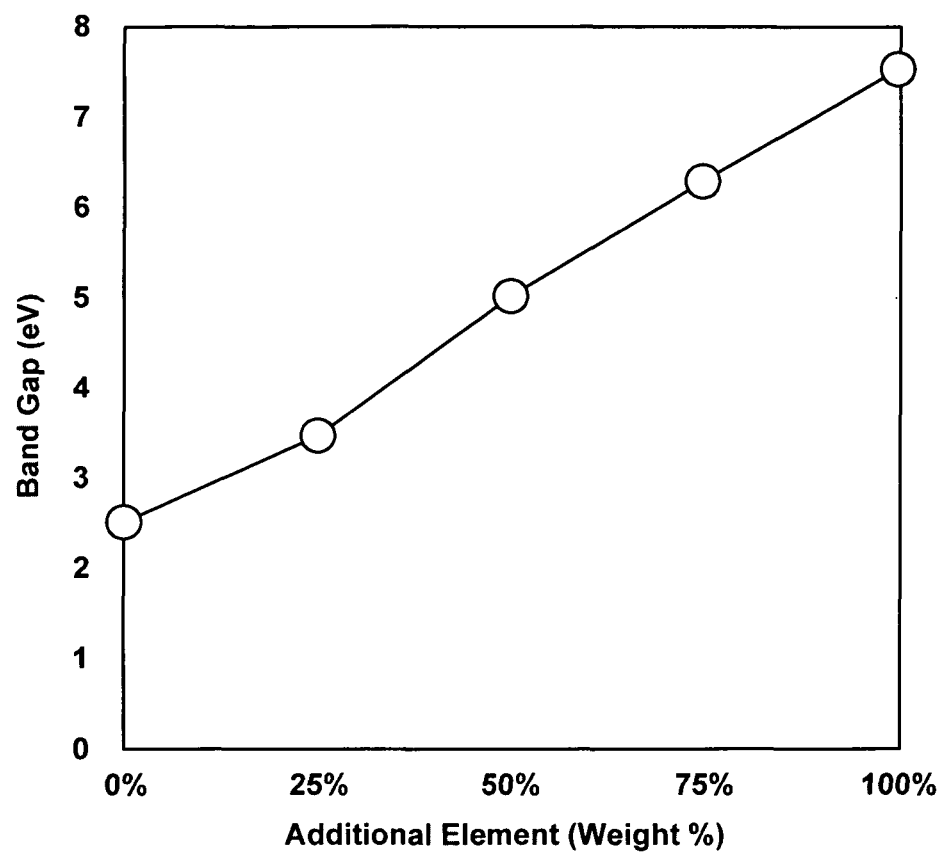
FIG. 4 schematically illustrates a plot of band gap as a function of the weight percentage of an additional element added to a dielectric metal oxide, in accordance with some embodiments.

FIG. 4 schematically illustrates a plot of band gap as a function of weight percentage of one or more additional elements added to a dielectric metal oxide, in accordance with some embodiments. The weight percentage is calculated based on the metal of the metal oxide and not including the oxygen of the metal oxide. In some embodiments, the dielectric metal oxide may be titanium oxide. In some embodiments, the dielectric metal oxide may be tantalum oxide. In some embodiments, the additional element may be one or more of aluminum, silicon, nitrogen, zirconium, or hafnium. In some embodiments, the additional element may increase the band gap of the metal oxide from about 2.5 electron volts to about 7.5 electron volts, depending on the concentration of the one or more additional elements. In some embodiments, the concentration of the one or more additional elements may be close to zero at the first surface 326.1 of the dielectric layer 326 of FIGS. 3A-3C. In some embodiments, the concentration of the one or more additional elements may be about 75% at the second surface 326.2 of the dielectric layer 326 of FIGS. 3A-3C. In some embodiments, the concentration of the one or more additional elements may increase monotonically through the thickness 326.3 of the dielectric layer 326 of FIGS. 3A-3C. In some embodiments, the metal of the metal oxide of dielectric layer 326 of FIGS. 3A-3C may have a high affinity for oxygen and may prevent or minimize formation of germanium oxide at first surface 326.1 of the dielectric layer 326 to provide better channel control over time, while the increasing concentration through thickness 326.3 of the one or more additional elements may provide an improved band gap and/or band gap alignment. In some embodiments, the one or more additional elements may be added to the dielectric layer 326 to modulate band gap of the metal oxide. Modulating the band gap may include increasing the band gap of the metal oxide.

Figure 5:
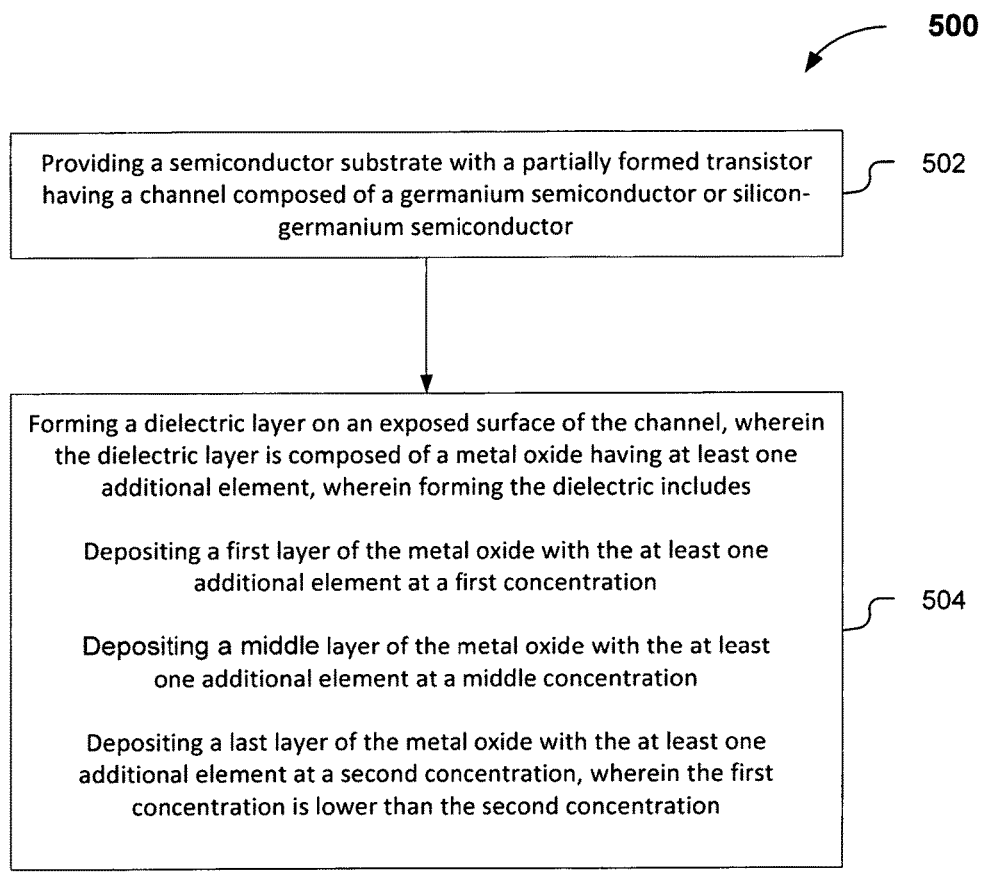
FIG. 5 schematically illustrates a process for fabricating a semiconductor device, in accordance with some embodiments.

FIG. 5 schematically illustrates a process 500 for fabricating a semiconductor device, in accordance with some embodiments.

At 502, the process 500 may include providing a semiconductor substrate with a transistor having a channel composed of a germanium semiconductor or silicon-germanium semiconductor. In some embodiments, the semiconductor substrate may be a silicon semiconductor, a germanium semiconductor, or a silicon-germanium semiconductor. In some embodiments, the transistor may be a planar transistor or a tri-gate transistor. The transistor may be a partially formed transistor without a gate on a channel.

At 504, the process 500 may include forming a dielectric layer on an exposed surface of the channel. In some embodiments, the dielectric layer may be composed of a metal oxide having at least one additional element in addition to a metal and oxygen. In some embodiments, forming the dielectric layer includes depositing layers of the metal oxide with the at least one additional element as a mixture of the metal oxide and the additional element. In some embodiments, the layers may be deposited by atomic layer deposition. In some embodiments, forming of the dielectric layer may include depositing a first layer of the metal oxide with the at least one additional element at a first concentration. In some embodiments, forming of the dielectric layer further may include depositing subsequent layers of the metal oxide with the at least one additional element at subsequent concentrations. In some embodiments, forming of the dielectric layer further may include depositing a last layer of the metal oxide with the at least one additional element at a second concentration, wherein the first concentration is lower than the second concentration.

In some embodiments, the process 500 may further comprise forming a gate electrode on the dielectric layer. In some embodiments, the metal oxide may include at least one of titanium oxide or tantalum oxide. In some embodiments, the at least one additional element may include at least one of aluminum, silicon, nitrogen, zirconium, or hafnium. In some embodiments, the metal oxide may be titanium dioxide, and the at least one additional element may be aluminum. In some embodiments, the middle concentration of the at least one additional element may increase monotonically during forming of the dielectric layer. In some embodiments, the first concentration may be from about 0% to about 30% by weight, and the second concentration may be from about 30% to about 70% by weight, wherein the balance of the weight percentage may be metal of the metal oxide. In some embodiments, the first concentration may be about 5%, and the second concentration may be about 30% to about 40%. In some embodiments, the first concentration may be from about 20% to about 30%, and the second concentration may be up to about 70%. In some embodiments, the forming of the dielectric layer may be by atomic layer deposition.

In some embodiments, the transistor is a tri-gate transistor having a fin coupled to and extending from the semiconductor substrate and spanning a source, a gate, and a drain of the tri-gate transistor, wherein the channel may include a top surface and two opposite side surfaces of the fin spanning the gate between the source and the drain, wherein the fin may be composed of the germanium semiconductor or the silicon-germanium semiconductor. In some embodiments, the fin may be composed of germanium, wherein the top surface of the fin may include a 100 crystal plane and the two opposite side surfaces may include a 110 crystal plane. In some embodiments, the fin and the semiconductor substrate may be a single body composed of the germanium semiconductor or the silicon-germanium semiconductor.

A dielectric metal oxide cap with one or more additional elements may provide a more stable interface between the dielectric and a germanium containing channel. Additionally, a dielectric metal oxide cap with one or more additional elements may make the germanium of a germanium containing channel less prone to oxidation at the interface between the dielectric and the channel. A reduction in germanium oxide formation and/or minimizing the impact of germanium oxide may allow better control of the channel over time.

Various operations are described as multiple discrete operations in turn, in a manner that is most helpful in understanding the claimed subject matter. However, the order of description should not be construed as to imply that these operations are necessarily order dependent.

Figure 6:
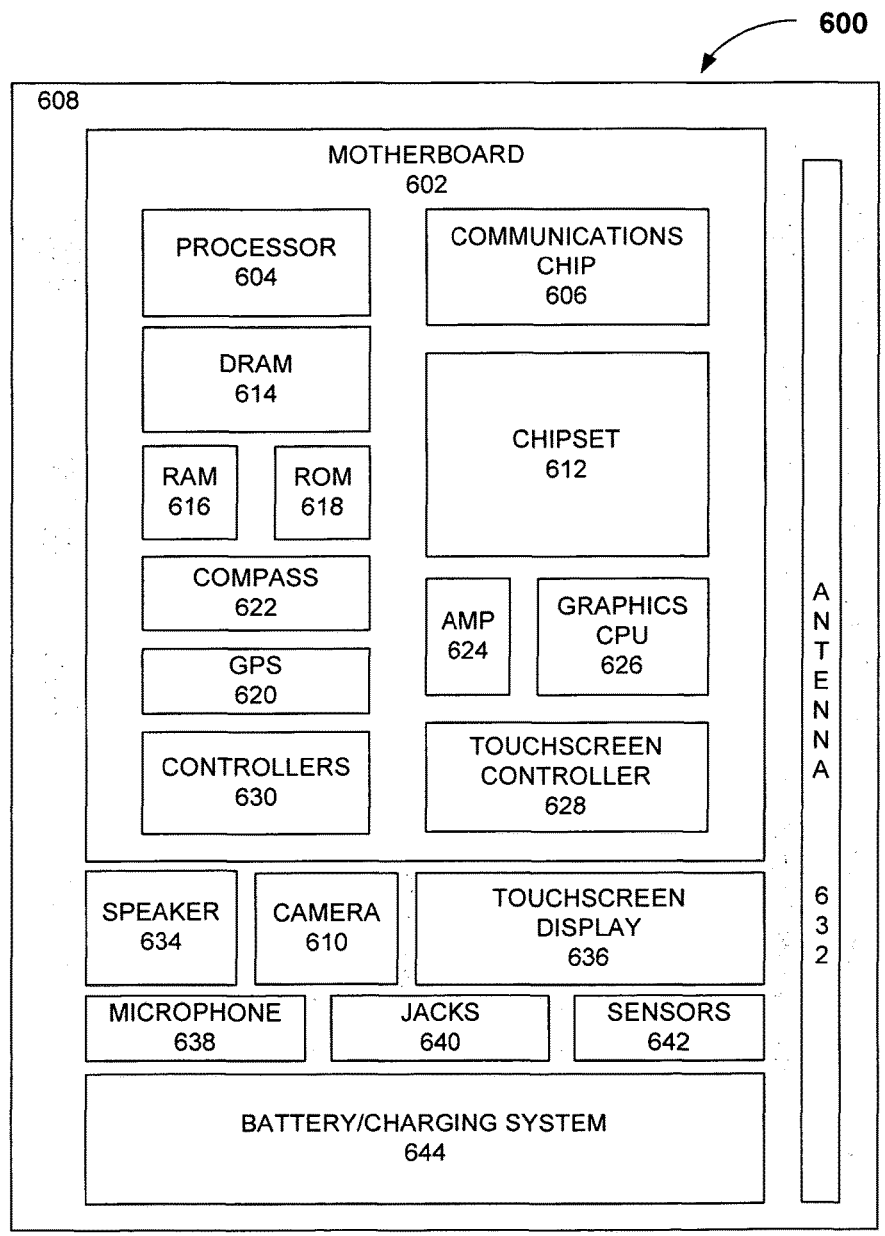
FIG. 6 schematically illustrates a computing device with a MOSFET having a dielectric metal oxide cap on a germanium containing channel as described herein, in accordance with some embodiments.

Embodiments of the present disclosure may be implemented into a system using any suitable hardware and/or software to configure as desired. FIG. 6 schematically illustrates a computing device 600 with a MOSFET having a dielectric metal oxide cap on a germanium containing channel as described herein, in accordance with some embodiments. In some embodiments, the dielectric metal oxide cap includes one or more additional elements as described herein, for example. In some embodiments, the transistor may be a planar transistor or a multi-gate transistor, such as a tri-gate transistor. The transistor with a dielectric metal oxide cap with one or more additional elements may provide a more stable interface between the dielectric and a germanium containing channel. Additionally, a dielectric metal oxide cap with one or more additional elements may make the germanium of a germanium containing channel less prone to oxidation at the interface between the dielectric and the channel. A reduction in germanium oxide formation and/or minimizing the impact of germanium oxide may allow better control of the channel over time.

The computing device 600 may house a board such as motherboard 602 (e.g., in housing 608). The motherboard 602 may include a number of components, including but not limited to a processor 604 and at least one communication chip 606. The processor 604 may be physically and electrically coupled to the motherboard 602. In some implementations, the at least one communication chip 606 may also be physically and electrically coupled to the motherboard 602. In further implementations, the communication chip 606 may be part of the processor 604.

Depending on its applications, computing device 600 may include other components that may or may not be physically and electrically coupled to the motherboard 602. These other components may include, but are not limited to, volatile memory (e.g., dynamic random access memory (DRAM) 614), non-volatile memory (e.g., read only memory (ROM) 618), flash memory, random access memory (RAM) 616, a graphics processor 626, a digital signal processor, a crypto processor, a chipset 612, an antenna 632, a display, a touchscreen display 636, a touchscreen controller 628, a battery 644, an audio codec, a video codec, a power amplifier 624, a global positioning system (GPS) device 620, a compass 622, microelectromechanical systems (MEMS) sensor 642, a Geiger counter, an accelerometer, a gyroscope, a speaker 634, a camera 610, and a mass storage device (such as hard disk drive), compact disk (CD), digital versatile disk (DVD), controllers 630, microphone 638, and/or jacks 640, and so forth. Not all of these components are illustrated in the figure.

As discussed above, one or more components of the computing device 600 may include a MOSFET having a dielectric metal oxide cap on a germanium containing channel as described herein, in accordance with some embodiments. For example, one or more of the processor 604, communication chip 606, chipset 612, DRAM 614, RAM 616, ROM 618, GPS device 620, compass 622, power amplifier 624, graphics CPU 626, touchscreen controller 628, and/or controllers 630 may include one or more MOSFETs having a dielectric metal oxide cap on a germanium containing channel as described herein, in accordance with some embodiments.

The communication chip 606 may enable wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Institute for Electrical and Electronic Engineers (IEEE) standards including WiGig, Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 606 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 606 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 606 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 606 may operate in accordance with other wireless protocols in other embodiments.

The computing device 600 may include a plurality of communication chips 606. For instance, a first communication chip 606 may be dedicated to shorter range wireless communications such as WiGig, Wi-Fi and Bluetooth and a second communication chip 606 may be dedicated to longer range wireless communications such as GPS, EDGE, GPRS, CDMA, WiMAX, LTE, EV-DO, and others.

The processor 604, communication chip 606, chipset 612, memory chips 614, 616, 618, and other devices with chips shown in computing device 600 may contain multi-gate transistors as described herein. The term "processor" may refer to any device or portion of a device that processes electronic data from registers and/or memory to transform that electronic data into other electronic data that may be stored in registers and/or memory.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. The computing device 600 may be a mobile computing device in some embodiments. In further implementations, the computing device 600 may be any other electronic device that processes data.

In various implementations, the computing device 600 may be a computer system, a server, a rack server, a blade server, and a super computer system, where components commonly used in mobile devices may be absent. In further implementations, the computing device 600 may be any other electronic device that processes data.

Various components of the computing device 600 shown as being comprised on the motherboard 602 are shown as an illustration of the embodiment and are not intended to be limiting.

EXAMPLES

According to various embodiments, the present disclosure describes a MOSFET gate stack where the channel contains germanium and a cap on the channel may be comprised of a dielectric metal oxide with at least one additional element deposited with the dielectric metal oxide. Further description is provided for devices and systems with the MOSFET gate stack and processes of making the MOSFET gate stack.

Example 1 of a semiconductor device may comprise a transistor formed on a semiconductor substrate and having a channel including a germanium semiconductor or a silicon-germanium semiconductor; a dielectric layer with a first surface coupled to the channel and including a metal oxide interspersed with at least one additional element, the at least one additional element to modulate a band gap of the dielectric layer; and a gate electrode coupled to a second surface of the dielectric layer, the second surface opposite the first surface through a thickness of the dielectric layer.

Example 2 may include the subject matter of Example 1 and other examples herein, wherein the semiconductor substrate is a silicon semiconductor, a germanium semiconductor, or a silicon-germanium semiconductor.

Example 3 may include the subject matter of Example 1 and other examples herein, wherein the metal oxide includes at least one of titanium oxide or tantalum oxide.

Example 4 may include the subject matter of Example 1 and other examples herein, wherein the at least one additional element includes at least one of aluminum, silicon, nitrogen, zirconium, or hafnium.

Example 5 may include the subject matter of Example 1 and other examples herein, wherein the metal oxide is titanium dioxide and the at least one additional element is aluminum.

Example 6 may include the subject matter of Example 1 and other examples herein, wherein the dielectric layer has a first concentration of the at least one additional element at the first surface and a second concentration of the at least one additional element at the second surface, wherein the first concentration is lower than the second concentration.

Example 7 may include the subject matter of Example 6 and other examples herein, wherein the concentration of the at least one additional element increases monotonically through the thickness of the dielectric layer from the first surface to the second surface.

Example 8 may include the subject matter of Example 6 and other examples herein, wherein the first concentration is from about 0% to about 30% by weight and the second concentration is from about 30% to about 70% by weight, wherein a balance of a weight percentage is metal of the metal oxide.

Example 9 may include the subject matter of Example 8 and other examples herein, wherein the first concentration is about 5% and the second concentration is about 30% to about 40%.

Example 10 may include the subject matter of Example 8 and other examples herein, wherein the first concentration is from about 20% to about 30% and the second concentration is up to about 70%.

Example 11 may include the subject matter of Example 6 and other examples herein, wherein the first concentration, the second concentration, and a concentration profile through the thickness of the dielectric layer of the at least one additional element are selected to increase the band gap of the metal oxide of the dielectric layer by at least three electron volts.

Example 12 may include the subject matter of any one of Examples 1-11 and other examples herein, wherein the transistor is a tri-gate transistor having a fin coupled to and extending from the semiconductor substrate and spanning a source, a gate, and a drain of the tri-gate transistor, wherein the channel includes a top surface and two opposite side surfaces of the fin spanning the gate between the source and the drain, wherein the fin is composed of the germanium semiconductor or the silicon-germanium semiconductor.

Example 13 may include the subject matter of Example 12 and other examples herein, wherein the fin and the semiconductor substrate are a single body composed of the germanium semiconductor or the silicon-germanium semiconductor.

Example 14 may include the subject matter of Example 12 and other examples herein, wherein the fin is composed of germanium, wherein the top surface of the fin includes a 100 crystal plane and the two opposite side surfaces include a 110 crystal plane.

Example 15 may include the subject matter of Example 12 and other examples herein, wherein the source comprises a raised source, and the drain comprises a raised drain.

Example 16 may include the subject matter of Example 1 and other examples herein, wherein the channel is undoped.

Example 17 may include the subject matter of Example 1 and other examples herein, wherein the channel is doped with a p-type dopant.

Example 18 of a process for fabricating a semiconductor device may comprise providing a semiconductor substrate with a partially formed transistor disposed on the semiconductor substrate and having a channel including a germanium semiconductor or silicon-germanium semiconductor; and forming a dielectric layer on an exposed surface of the channel, wherein the dielectric layer includes a metal oxide interspersed with at least one additional element, wherein forming the dielectric layer includes depositing a first layer of the metal oxide with the at least one additional element at a first concentration, depositing a middle layer of the metal oxide with the at least one additional element at a middle layer concentration, and depositing a last layer of the metal oxide with the at least one additional element at a second concentration, wherein the first concentration is lower than the second concentration.

Example 19 may include the subject matter of Example 18 and other examples herein, wherein the process further may comprise forming a gate electrode on the dielectric layer.

Example 20 may include the subject matter of Example 18 and other examples herein, wherein the semiconductor substrate is a silicon semiconductor, a germanium semiconductor, or a silicon-germanium semiconductor.

Example 21 may include the subject matter of Example 18 and other examples herein, wherein the metal oxide includes at least one of titanium oxide or tantalum oxide.

Example 22 may include the subject matter of Example 18 and other examples herein, wherein the at least one additional element includes at least one of aluminum, silicon, nitrogen, zirconium, or hafnium.

Example 23 may include the subject matter of Example 18 and other examples herein, wherein the metal oxide is titanium dioxide and the at least one additional element is aluminum.

Example 24 may include the subject matter of Example 18 and other examples herein, wherein the middle layer includes at least two additional layers, wherein the middle layer concentration of the at least one additional element increases monotonically during forming of the dielectric layer.

Example 25 may include the subject matter of Example 18 and other examples herein, wherein the first concentration is from about 0% to about 30% by weight and the second concentration is from about 30% to about 70% by weight, wherein a balance of a weight percentage is metal of the metal oxide.

Example 26 may include the subject matter of Example 25 and other examples herein, wherein the first concentration is about 5% and the second concentration is about 30% to about 40%.

Example 27 may include the subject matter of Example 25 and other examples herein, wherein the first concentration is from about 20% to about 30% and the second concentration is up to about 70%.

Example 28 may include the subject matter of Example 25 and other examples herein, wherein the forming of the dielectric layer is by atomic layer deposition.

Example 29 may include the subject matter of any one of Examples 18-28 and other examples herein, wherein the transistor is a tri-gate transistor having a fin coupled to and extending from the semiconductor substrate and spanning a source, a gate, and a drain of the tri-gate transistor, wherein the channel includes a top surface and two opposite side surfaces of the fin spanning the gate between the source and the drain, wherein the fin is composed of the germanium semiconductor or the silicon-germanium semiconductor.

Example 30 may include the subject matter of Example 29 and other examples herein, wherein the fin is composed of germanium, wherein the top surface of the fin includes a 100 crystal plane and the two opposite side surfaces include a 110 crystal plane.

Example 31 may include the subject matter of Example 29 and other examples herein, wherein the fin and the semiconductor substrate are a single body composed of the germanium semiconductor or the silicon-germanium semiconductor.

Example 32 of a computing device may comprise a circuit board; and a semiconductor device coupled to the circuit board and including a plurality of tri-gate transistors disposed on the semiconductor device, wherein one or more of the tri-gate transistors include a channel including a germanium semiconductor or a silicon-germanium semiconductor, a dielectric layer with a first surface coupled to the channel and including a metal oxide and interspersed with at least one additional element, the at least one additional element to modulate a band gap of the dielectric layer, and a gate electrode coupled to a second surface of the dielectric layer, the second surface opposite the first surface through a thickness of the dielectric layer, wherein a concentration of the at least one additional element increases monotonically from the first surface to the second surface.

Example 33 may include the subject matter of Example 32 and other examples herein, wherein the metal oxide includes at least one of titanium oxide or tantalum oxide, and the at least one additional element includes at least one of aluminum, silicon, nitrogen, zirconium, or hafnium.

Example 34 may include the subject matter of Example 32 and other examples herein, wherein a first concentration is from 0% to about 30% by weight and a second concentration is from about 30% to about 70% by weight, wherein a balance of a weight percentage is metal of the metal oxide.

Example 35 may include the subject matter of Example 32 and other examples herein, wherein the metal oxide is titanium dioxide and the at least one additional element is aluminum.

Example 36 may include the subject matter of Example 32 and other examples herein, wherein the computing device is a wearable device or a mobile computing device, the wearable device or the mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

Example 37 may include the subject matter of Example 32 and other examples herein, wherein the computing device is a desktop computer, a server, or a super computer and includes one or more of a display, a processor, a cooling system, a chipset, a memory, a slot, a computer bus interface, a local area network controller, a port, or interface devices coupled with the circuit board.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments. The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize. These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A semiconductor device, comprising:
a transistor formed on a semiconductor substrate and having a channel including a germanium semiconductor or a silicon-germanium semiconductor;
a dielectric layer with a first surface coupled to the channel and including a metal oxide to modulate a band gap of the dielectric layer, wherein the metal oxide includes a ternary oxide having a first element, an additional element, and oxygen (O), wherein the first element is titanium (Ti) or tantalum (Ta), and the additional element is aluminum (Al), zirconium (Zr), or hafnium (Hf); and
a gate electrode coupled to a second surface of the dielectric layer, the second surface opposite the first surface through a thickness of the dielectric layer.

2. The semiconductor device of claim 1, wherein the semiconductor substrate is a silicon semiconductor, a germanium semiconductor, or a silicon-germanium semiconductor.

3. The semiconductor device of claim 1, wherein the metal oxide is titanium dioxide and the additional element is aluminum.

4. The semiconductor device of claim 1, wherein the dielectric layer has a first concentration of the additional element at the first surface and a second concentration of the additional element at the second surface, wherein the first concentration is lower than the second concentration.

5. The semiconductor device of claim 4, wherein the concentration of the additional element increases monotonically through the thickness of the dielectric layer from the first surface to the second surface.

6. The semiconductor device of claim 4, wherein the first concentration is from about 0% to about 30% by weight and the second concentration is from about 30% to about 70% by weight, wherein a balance of a weight percentage is metal of the metal oxide.

7. The semiconductor device of claim 4, wherein the first concentration, the second concentration, and a concentration profile through the thickness of the dielectric layer of the additional element are selected to increase the band gap of the metal oxide of the dielectric layer by at least three electron volts.

8. The semiconductor device of claim 1, wherein the transistor is a tri-gate transistor having a fin coupled to and extending from the semiconductor substrate and spanning a source, a gate, and a drain of the tri-gate transistor, wherein the channel includes a top surface and two opposite side surfaces of the fin spanning the gate between the source and the drain, wherein the fin is composed of the germanium semiconductor or the silicon-germanium semiconductor.

9. The semiconductor device of claim 8, wherein the fin and the semiconductor substrate are a single body composed of the germanium semiconductor or the silicon-germanium semiconductor.

10. A process for fabricating a semiconductor device, comprising:
providing a semiconductor substrate with a transistor disposed on the semiconductor substrate and having a channel including a germanium semiconductor or silicon-germanium semiconductor; and
forming a dielectric layer on an exposed surface of the channel, wherein the dielectric layer includes a metal oxide, wherein the metal oxide includes a ternary oxide having a first element, an additional element, and oxygen (O), wherein the first element is titanium (Ti) or tantalum (Ta), and the additional element is aluminum (Al), zirconium (Zr), or hafnium (Hf), and wherein forming the dielectric layer includes
depositing a first layer of the metal oxide with the additional element at a first concentration,
depositing a middle layer of the metal oxide with the additional element at a middle layer concentration, and
depositing a last layer of the metal oxide with the additional element at a second concentration, wherein the first concentration is lower than the second concentration.

11. The process of claim 10, wherein the semiconductor substrate is a silicon semiconductor, a germanium semiconductor, or a silicon-germanium semiconductor.

12. The process of claim 10, wherein the metal oxide is titanium dioxide and the additional element is aluminum.

13. The process of claim 10, wherein the middle layer includes at least two additional layers, wherein the middle layer concentration of the additional element increases monotonically during forming of the dielectric layer.

14. The process of claim 10, wherein the first concentration is from about 0% to about 30% by weight and the second concentration is from about 30% to about 70% by weight, wherein a balance of a weight percentage is metal of the metal oxide.

15. The process of claim 10, wherein the transistor is a tri-gate transistor having a fin coupled to and extending from the semiconductor substrate and spanning a source, a gate, and a drain of the tri-gate transistor, wherein the channel includes a top surface and two opposite side surfaces of the fin spanning the gate between the source and the drain, wherein the fin is composed of the germanium semiconductor or the silicon-germanium semiconductor.

16. The process of claim 15, wherein the fin and the semiconductor substrate are a single body composed of the germanium semiconductor or the silicon-germanium semiconductor.

17. A computing device, comprising:
a circuit board; and
a semiconductor device coupled to the circuit board and including a plurality of tri-gate transistors disposed on the semiconductor device, wherein one or more of the tri-gate transistors include
a channel including a germanium semiconductor or a silicon-germanium semiconductor,
a dielectric layer with a first surface coupled to the channel and including a metal oxide to modulate a band gap of the dielectric layer, wherein the metal oxide includes a ternary oxide having a first element, an additional element, and oxygen (O), wherein the first element is titanium (Ti) or tantalum (Ta), and the additional element is aluminum (Al), zirconium (Zr), or hafnium (Hf), and a gate electrode coupled to a second surface of the dielectric layer, the second surface opposite the first surface through a thickness of the dielectric layer, wherein a concentration of the additional element increases monotonically from the first surface to the second surface.

18. The computing device of claim 17, wherein a first concentration is from 0% to about 30% by weight and a second concentration is from about 30% to about 70% by weight, wherein a balance of a weight percentage is metal of the metal oxide.

19. The computing device of claim 17, wherein the metal oxide is titanium dioxide and the additional element is aluminum.

20. The computing device of claim 17, wherein the computing device is a wearable device or a mobile computing device, the wearable device or the mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

* * * * *